United States Patent [19]

Storrow et al.

[11] Patent Number: 5,010,444
[45] Date of Patent: * Apr. 23, 1991

[54] RACK MOUNTED CIRCUIT BOARD

[75] Inventors: Alan J. Storrow; Nigel J. Knighton, both of Northampton, England

[73] Assignee: Radstone Technology Limited, Northampton, Northamptonshire, England

[*] Notice: The portion of the term of this patent subsequent to Nov. 7, 2006 has been disclaimed.

[21] Appl. No.: 426,548

[22] Filed: Oct. 24, 1989

Related U.S. Application Data

[63] Continuation of Ser. No. 121,023, Nov. 13, 1987, Pat. No. 4,879,634.

[51] Int. Cl.$^5$ ............................................. H05K 7/20
[52] U.S. Cl. ................................ 361/386; 165/80.3; 361/388; 361/415
[58] Field of Search ............ 165/80.2, 80.3, 185; 361/383, 385, 386, 387, 388, 391, 415; 211/41; 357/81

[56] References Cited

U.S. PATENT DOCUMENTS

| | | | |
|---|---|---|---|
| 3,631,325 | 12/1971 | Wenz | 361/387 |
| 4,157,583 | 6/1979 | Basmajian | 361/388 |
| 4,241,381 | 12/1980 | Cobaugh | 361/413 |
| 4,318,157 | 3/1982 | Rank | 361/388 |
| 4,470,100 | 9/1984 | Rebaudo | 361/415 |
| 4,510,553 | 4/1985 | Faultersack | 361/399 |
| 4,819,713 | 4/1989 | Weisman | 165/80.3 |
| 4,879,634 | 11/1989 | Storrow | 165/80.3 |

Primary Examiner—Gerald P. Tolin
Attorney, Agent, or Firm—Fleit, Jacobson, Cohn, Price, Holman & Stern

[57] ABSTRACT

A circuit board (10) is described in which VMEbus connectors (15), wedge-lock clamping means (19), and a heat management layer (13) are mounted on the same side of the board as that whereon the components are mounted and wherein edge guides, are provided in thermal contact with the heat management layer but present heat dissipating surfaces at the opposite side of the board.

14 Claims, 2 Drawing Sheets

RACK MOUNTED CIRCUIT BOARD

This is a continuation of application Ser. No. 07/121,023, filed Nov. 13, 1987, now U.S. Pat. No. 4,879,634.

This invention relates to rack-mounted circuit boards for mounting in a slot of a box, each slot being defined by a pair of opposed grooves which guide and support opposite edges of the board, a bus arrangement being provided at the rear of the box, and appropriately located connectors on the board and of the bus, mating on sliding of the board into the slot of the box.

Such boards can, generally, be classified under two headings these are "conduction cooled" boards and "convection cooled" boards. Conduction cooled boards have a metal heat management layer on one surface in physical contact with components mounted on the board. The heat management layer extends to the side opposite edges of the board and provides thereat conduction surfaces arranged, in use, to contact heat sinks defined by "cold" surfaces of the opposed grooves of a slot. It may, in use, be clamped to the cold surfaces to ensure optimum thermal conduction of excess heat from the layer (and hence components on the board) to the cold surfaces.

Convection cooled boards do not usually have a heat management layer. They rely on a flow of air over components on the board to dissipate excess heat generated, in use, by the components. The flow of air may be caused by natural convection or, more usually, by fan assistance.

Conduction cooled boards, generally, have military application whilst convection cooled boards are used mainly in commercial application.

A common standard of physical dimensions for convection cooled circuit boards, connections and boxes, used extensively in commercial applications, is VMEbus (VERSA MODULE EUROPE bus). For rack mounted boards, this standard requires that there should be, at each of the said opposite edges of the board, a clear marginal board area, in the plane of the board, at lest 0.1" in width. Commensurate pairs of grooves define box slots. Further, board mounted connectors and box mounted bus connections are located closely adjacent the clear marginal board areas and to one side of the plane of the board, i.e. on the component supporting surface thereof.

The widespread commercial use of convection cooled boards and boxes has reduced the prices and increased the availability of such apparatus. It would be convenient to be able to test, for example, a conduction cooled board in a convection cooled box. However, it will be appreciated that problems exist if it is desired to insert a conduction cooled board into a VMEbus box.

Firstly, the heat management layer is not in the plane of the board itself yet, conventionally, provides the slot-guided opposite edges thereof. Secondly, board clamps such as wedge locks, generally provided on the non-component side of the conduction cooled board are located less than 0.1" from the opposite marginal edges of the board. Further, the provision of board clamps at the opposite side of the board, to the VME connectors increases the overall effective thickness of the board thereby contravening the VMEbus specification so as to render difficult the design of a conduction cooled board that could be, for example, tested in a low-cost VMEbus box but which could, thereafter be used in a box providing slots with "cold" surfaces.

It is an object of the present invention to provide a conduction cooled board wherein the aforesaid problems are overcome.

According to the present invention, there is provided a rack-mountable circuit board of substantially rectangular shape comprising a substrate having a first surface whereon a printed circuit may be provided, a second surface having a thermally conductive heat management layer bonded thereto, said second surface being arranged to support components in thermal contact with said heat management layer, said board having two opposite edges, a guide mounted at each of said opposite edges, said guides providing first portions in thermal contact with said heat management layer, second portions presenting conduction surfaces at said first surface of the substrate, and third portions, in the plane of said substrate, presenting clear margins enabling the board to be inserted, in use, in a convection cooled box, and connectors mounted on and projecting from said second surface adjacent but inwardly of said third portions of said edge guides.

The invention will be described further, by way of example, with reference to the accompanying drawings, in which:

FIG. 1b is an end elevation view of the board from the right hand side of FIG. 1a;

Figure 1A:
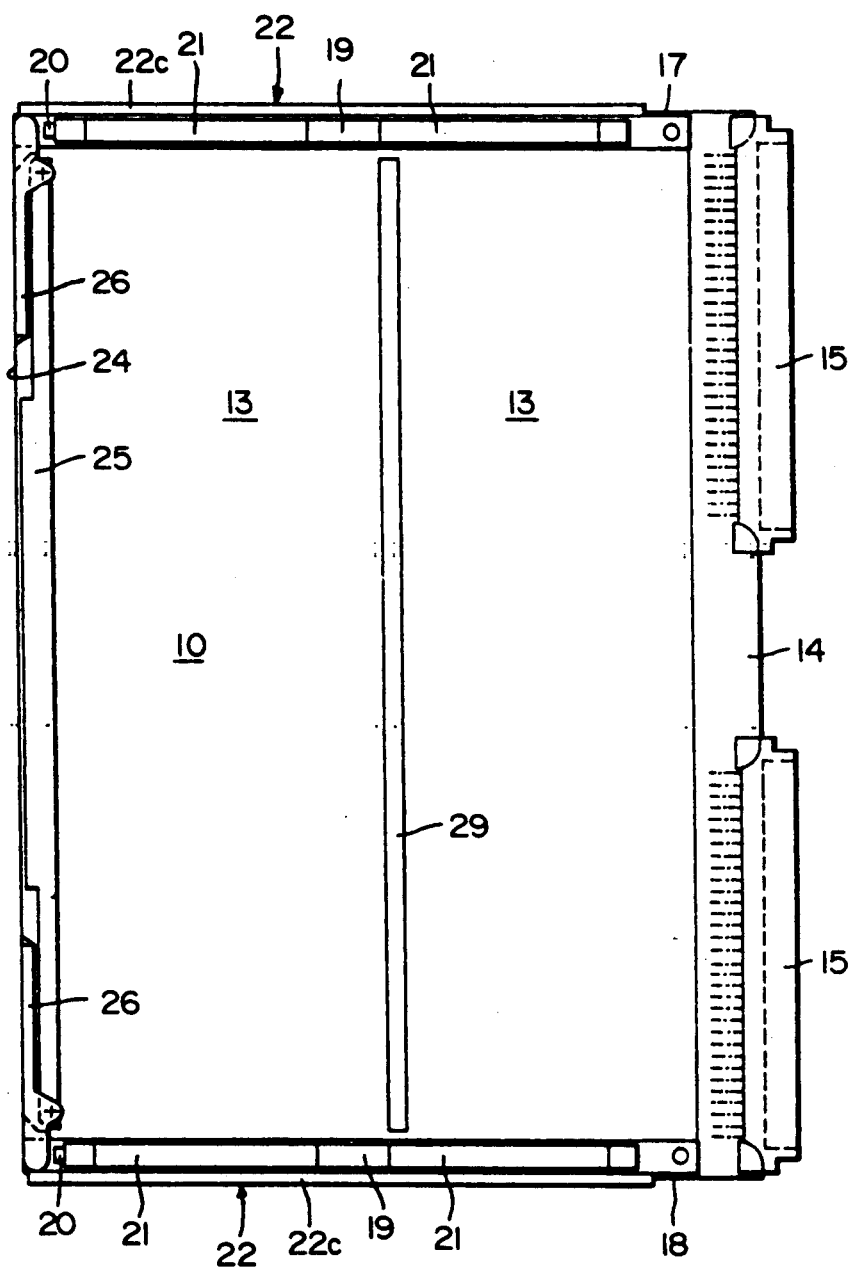
FIG. 1a is a plan view of a circuit board constructed in accordance with the present invention.

As shown in the drawings, a substantially rectangular conduction cooled circuit board, in accordance with a preferred embodiment of the present invention, comprises a substrate 10 of an insulating material such as resin bonded glass fibre. The substrate 10 may be laminar, i.e., multilayer, with through-plated holes, but for the purpose of the present description, a single layer substrate 10 is envisaged. The substrate 10 has a first surface 11 and a second surface 12 opposite to the first surface 11. The substrate 10 has on the first surface 11, a printed circuit. On its second surface 12, the substrate 10 has a heat management layer 13 of annealed aluminium is bonded. The layer 13 is provided with cut-outs (not shown) permitting circuit components, such as packaged integrated circuits (also not shown) to be mounted thereon, in thermal contact therewith but with the package connectors extending through the cut-outs, and through the substrate, to be connected, by soldering, to the printed circuit on the first surface 11 of the substrate 10.

Figure 4:
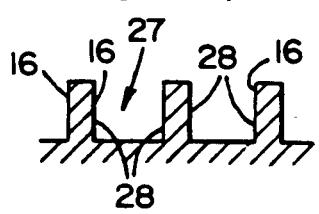

The board is dimensioned so as to be compatible with VMEbus (VERSAModule Europe bus) specification and has, adjacent a first edge 14, two VMEbus connectors 15. The board is arranged for rack-mounting, as desired, in guide slots 16 (see FIG. 4) of a conduction cooled box (not shown) having a bus such that, on insertion of the circuit board into such a box, the connectors 15 appropriately mate with connectors of the bus of the box. Along two opposite edges 17 and 18 adjacent the first edge 14 of the board, edge guides or sliders 22 are provided. The guides 22 are of aluminium but are not annealed so as to be harder and more wear-resistant than the aluminium of the heat management layer 13. The guides 22 have first portions 22a underlying the edges of the heat management layer 13 and the first portions 22a are clamped or bonded thereto in good thermal contact therewith. Along each of said opposite edges 17, 18, respective wedge-lock clamping means 19 are provided in opposed relation to the guides 22. The clamping means 19 are of conventional form and serve to expand perpendicularly of the board, on tightening screws 20 thereof, after the board has been inserted into the rack, by causing ramp shaped portions 21 thereof to be cammed away from the board.

Figure 2:
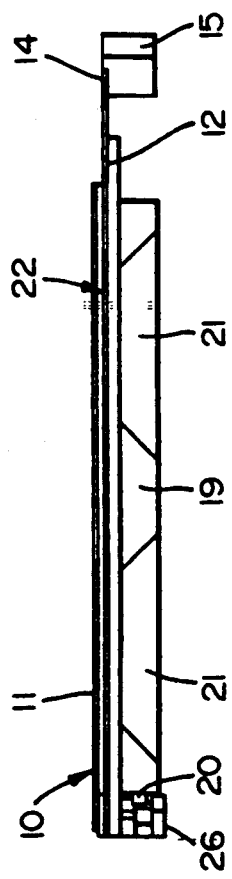
FIG. 2 is a side elevation of the board shown in FIG. 1.
Figure 3:
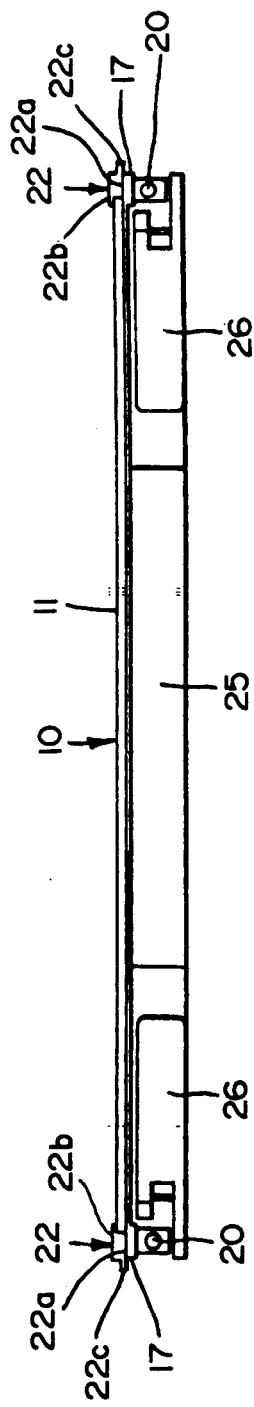
FIG. 3 is an end elevation of the board shown in FIGS. 1 and 2 from the left hand side of FIG. 1a; and, FIG. 4 is a diagrammatic representation of the manner in which the board is rack-mounted.

As can be seen from FIG. 2, the clamping means 19 project from the second surface 12 of the substrate 10 a predetermined distance. As can also be seen from FIG. 2, the connectors 15 also project from the second surface 12 of the substrate 10, in the same direction as the clamping means 19, a distance substantially the same as the predetermined distance and so do not increase the overall dimension of the board in this direction.

At a fourth edge 24 of the board, opposite the first edge 14, a front plate 25 is mounted to the board. The front plate 25 has pivotally mounted ejection latches 26 facilitating insertion and removal of the board from a box.

In use, the board as above described is intended for rack-mounting either in a VMEbus box or a military box. A military box has opposed racks of which one is diagrammatically illustrated in FIGS. 4 at 27, the teeth of the rack are constituted by the slots 16. Adjacent slots 16 are of width such as to be able to accommodate the board and its wedge locks and, of course, that portion of the VMEbus connector which is adjacent the edge of the board. The distance between opposed troughs of the racks is slightly greater than the width of the board between the edge guides 22 whereby the board may be slid into a respective upper and lower pair of the slots 16. In so doing, the connectors 15 mate with appropriate opposite gender connectors (not shown) on a bus (also not shown) of the box.

After completion insertion in a military box screws 20 are then tightened to expand the portions 21 so that the board is tightly clamped between opposing faces 28 of the slots 16. Such clamping assures good thermal contact between conduction surfaces presented by second portions 22b of the edge guides 22 and the heat removing faces 28 ("cold surfaces"), and, in turn, a good thermal contact between first portions 22a of the edge guides 22 and underlying edges of the heat management layer 13.

In a commercial VMEbus box, the slots (not shown) comprise opposing pairs of grooves and the extremities 22c, constituting third portions of the edge guides 22, are dimensioned to be a sliding fit in such grooves. The extremities 22c provide the clear board margins 0.1" wide, in the plane of the substrate 10, required by VMEbus specification. No clamping is employed and cooling is by thermal convection (fan cooled).

A board constructed in accordance with the present invention, may thus be used in existing convection cooled VMEbus boxes. Further, boards as described, can be mounted in either conduction or convection cooled boxes made to facilitate testing, or in development work. Thus, in development work, the need for boxes to expensive military specification can be eliminated.

Figure 1B:
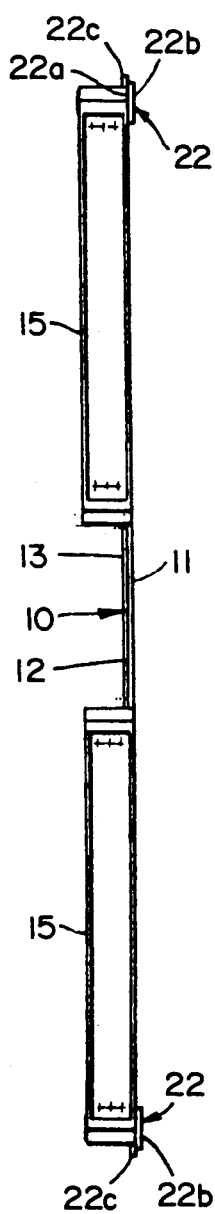

The invention is not confined to the precise details of the foregoing examples and variations may be made thereto. For instance, as shown in FIG. 1, a rigidifier 29 may be provided transversely of the board to inhibit vibration of the board in use. The board itself may be of any suitable material used in the manufacture of printed circuit boards. The heat management layer 13, when present, need not be of aluminium but may be of copper or another good thermal conductor. Similarly, the edge guides 22 may be of another material of relatively high mechanical strength and good thermal conductivity. Other variations are possible within the scope of the present invention as defined in the appended claims.

We claim:

1. A circuit board comprising:
   a substrate having opposed first and second surfaces;
   a printed circuit provided on said first surface;
   a thermally conductive heat management layer, bonded to said second surface, with which components supported on said circuit board are in thermal contact;
   at least one connector mounted on said circuit board adjacent a first edge of said circuit board;
   at least one guide having a conduction surface provided at each of a pair of opposite edges of said circuit board adjacent said first edge, each guide having a first portion in thermal communication with said heat management layer;
   board clamping means mounted longitudinally on said pair of opposing edges for urging the conduction surfaces of the guides into thermal contact with a surface of a conduction cooled box and clamping the circuit board in the conduction cooled box when the circuit board is mounted therein; and
   projection means formed by a second portion of each guide for inserting said circuit board in grooves of a convection cooled box when the circuit board is mounted therein.

2. A circuit board comprising:
   a substrate having opposed first and second surfaces;
   a printed circuit provided on said first surface;
   at least one connector mounted on said circuit board adjacent a first edge of said circuit board;
   heat management means provided on said second surface for conducting excess heat from components supported on said circuit board including at least one guide at each of a pair of opposite edges of said circuit board adjacent said first edge, said guide defining a conduction surface and projection means formed by each guide for inserting said circuit board in grooves of a convection cooled box when the circuit board is mounted therein; and
   board clamping means mounted along each of said pair of opposite edges for urging each conduction surface of the guides into thermal contact with a surface of a conduction cooled box and clamping the circuit board in the conduction cooled box when the circuit board is mounted therein.

3. A circuit board as defined in claim 2, wherein the heat management means comprises a heat management layer bonded to said second surface.

4. A circuit board as defined in claim 3, wherein the components are mounted in thermal contact with said heat management layer and have connectors extending through said substrate to be connected to said printed circuit provided on said first surface.

5. A circuit board as defined in claim 2, and further comprising means facilitating insertion and removal of the circuit board from a box mounted at an edge of said circuit board opposite said first edge.

6. A circuit board as defined in claim 5, wherein the means facilitating insertion and removal of the circuit board comprise pivotally mounted ejectors located at said edge of said circuit board opposite said first edge.

7. A circuit board as defined in claim 2, wherein said board clamping means can be expanded perpendicularly relative to the first and second surfaces to provide said thermal contact after the circuit board has been inserted in a conduction cooled box.

8. A circuit board as defined in claim 3, wherein said heat management layer is of annealed aluminum.

9. A circuit board as defined in claim 8, wherein each guide is of unannealed aluminum which is harder and more wear resistant than the aluminum of said heat management layer.

10. A circuit board as defined in claim 3, wherein the at least one guide is separate from said heat management layer and is clamped in good thermal contact to said heat management layer.

11. A circuit board as defined in claim 3, wherein the at least one guide is separate from said heat management layer and is bonded in good thermal contact to said heat management layer.

12. A circuit board as defined in claim 7, and further comprising tightening screws which can be tightened to expand each conduction surface into thermal contact with heat removing faces of a conduction cooled box.

13. A circuit board as defined in claim 2, wherein the board clamping means projects from said second surface of the board substantially the same distance and in the same direction from the heat management means as said at least one connector.

14. The combination of a box, a rack mounted circuit board, and a board clamping means removably clamping the circuit board in the box, said box comprising a bus arrangement provided at a rear portion of said box; and a rack including at least one slot into which said circuit board slides;

said circuit board comprising a substrate having opposed first and second surfaces; a printed circuit provided on said first surface; at least one connector mounted on said circuit board adjacent a first edge of said circuit board which connects said printed circuit to said bus arrangement; heat management means provided on said second surface conducting excess heat from components supported on said circuit board including at least one guide at each of a pair of opposite edges of said circuit board adjacent said first edge, said guide defining a conduction surface and projection means formed by each guide for inserting said circuit board in said rack; and said board clamping means urging each conduction surface of the guides into thermal contact with a surface of said rack and clamping the circuit board.

* * * * *